(12) United States Patent
Yang

(10) Patent No.: US 8,560,918 B1
(45) Date of Patent: Oct. 15, 2013

(54) METHOD AND APPARATUS FOR DYNAMICALLY SELECTING AN ERROR CORRECTION CODE TO BE APPLIED TO DATA IN A COMMUNICATION SYSTEM

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 512 days.

(21) Appl. No.: 12/757,222

(22) Filed: Apr. 9, 2010

Related U.S. Application Data

(60) Provisional application No. 61/171,357, filed on Apr. 21, 2009.

(51) Int. Cl.
*H03M 13/00* (2006.01)
*G11C 29/00* (2006.01)

(52) U.S. Cl.
USPC .......................................... 714/758; 714/763

(58) Field of Classification Search
USPC .......... 714/763, 746, 755, 758, 769, 774, 799
See application file for complete search history.

(56) References Cited

U.S. PATENT DOCUMENTS

| | | | | |
|---|---|---|---|---|
| 4,047,151 A * | 9/1977 | Rydbeck et al. | ............... | 714/774 |
| 5,381,276 A * | 1/1995 | Choi | ............... | 360/51 |
| 5,875,280 A * | 2/1999 | Takaiwa et al. | ............... | 386/224 |
| 6,747,827 B1 * | 6/2004 | Bassett et al. | ............... | 360/53 |
| 7,457,431 B2 * | 11/2008 | Shi et al. | ............... | 382/100 |
| 2002/0150188 A1 | 10/2002 | Rudolf | | |
| 2005/0088996 A1 | 4/2005 | Kawamura et al. | | |
| 2006/0294448 A1 * | 12/2006 | Wybenga et al. | ............... | 714/758 |
| 2007/0089023 A1 * | 4/2007 | Sanders | ............... | 714/758 |
| 2007/0121706 A1 | 5/2007 | Nakamura et al. | | |
| 2007/0171730 A1 * | 7/2007 | Ramamoorthy et al. | ............... | 365/185.33 |
| 2007/0183493 A1 * | 8/2007 | Kimpe | ............... | 375/240.1 |
| 2008/0148126 A1 * | 6/2008 | Eilert et al. | ............... | 714/755 |
| 2008/0163026 A1 * | 7/2008 | Varnica et al. | ............... | 714/755 |
| 2009/0125790 A1 * | 5/2009 | Iyer et al. | ............... | 714/773 |
| 2009/0150748 A1 * | 6/2009 | Egner et al. | ............... | 714/758 |
| 2010/0023845 A1 * | 1/2010 | Cheng et al. | ............... | 714/790 |
| 2010/0115376 A1 * | 5/2010 | Shalvi et al. | ............... | 714/763 |
| 2010/0281340 A1 * | 11/2010 | Franceschini et al. | ............... | 714/763 |
| 2011/0051989 A1 * | 3/2011 | Gao et al. | ............... | 382/100 |
| 2011/0154158 A1 * | 6/2011 | Yurzola et al. | ............... | 714/758 |

OTHER PUBLICATIONS

Rosenthal, J.; York, F.V.; , "BCH convolutional codes," Information Theory, IEEE Transactions on , vol. 45, No. 6, pp. 1833-1844, Sep. 1999.*
Keun Soo Yim; Hyokyung Bahn; Kern Koh; , "A flash compression layer for SmartMedia card systems," Consumer Electronics, IEEE Transactions on , vol. 50, No. 1, pp. 192-197, Feb. 2004.*
Selavo, L.; Chiarulli, D.M.; Levitan, S.P.; , "Adaptive code modulation for 2D optical memories," Optical Memory and Optical Data Storage Topical Meeting, 2002. International Symposium on , vol., no., pp. 231-233, 2002.*

* cited by examiner

*Primary Examiner* — Cynthia Britt

(57) ABSTRACT

Embodiments provide methods, apparatuses, and articles of manufacture that encode and decode data based on various error correction codes. In one embodiment, a method may include receiving input data, encoding the input data with an error correction code that is selected from a plurality of error correction codes based on the size of the input data, and writing the encoded input data to a memory device. The encoded data can be subsequently, retrieved and decoded when needed.

22 Claims, 4 Drawing Sheets

METHOD AND APPARATUS FOR DYNAMICALLY SELECTING AN ERROR CORRECTION CODE TO BE APPLIED TO DATA IN A COMMUNICATION SYSTEM

CROSS-REFERENCES TO RELATED APPLICATIONS

The present application claims priority to U.S. Patent Application No. 61/171,357, filed Apr. 21, 2009, the entire disclosure of which is hereby incorporated by reference in its entirety except for those sections, if any, that are inconsistent with this disclosure.

TECHNICAL FIELD

Embodiments of the present disclosure relate to the field of data memory devices, and more particularly, to error correction coding and decoding.

BACKGROUND

During the life cycle of memory devices, for example, silicon-based non-volatile memory (NVM) devices, the devices are subject to degradation through normal usage. From a signal processing/coding point of view, this implies that that the communication channel quality degrades over time, which may eventually affect data reliability of the device. Flash devices, for example, are typically exposed to reliability issues such as read disturb, endurance, and retention as memory cells cycle through multiple read and/or write operations.

To account for these reliability issues, various communication systems utilize an error correction code (ECC) encoding scheme. In NVM devices, an ECC encoding scheme utilizes a memory data structure that is segregated into a payload portion and a redundancy portion. A divider segregates these portions and can be dynamically allocated whereby the size of the redundancy portion and strength of the ECC contained within the redundancy portion are selected in response to changing conditions. Different ECC's have relative advantages and disadvantages in terms of the strength of their error detection and correction ability, their memory space requirements, and their execution speed.

Generally variations in NVM devices or communication channels occur in a systematic manner over a period of time. As a result, redundancy within NVM devices may need to be reallocated. Media ages and use levels are monitored, and in response to changes in reliability, the size of the redundancy with respect to the payload can be changed to more appropriate ECC. This reallocation can occur dynamically or at regular intervals, but it remains channel dependent. In other words, the ECC scheme is chosen to adapt to the channel conditions in a predetermined manner.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

In various embodiments, a method of encoding and decoding data utilizing an error correction code (ECC) is disclosed. The method comprises receiving input data; encoding, by an encoder, the input data with an ECC, wherein the error correction code is selected from a plurality of ECCs based on a size of the input data, and writing the encoded input data to a memory device. In one embodiment, a first portion of the encoded input data is written to a first memory device and a second portion of the encoded input data is written to a second memory device. Thus the encoded input data is capable of storage across multiple devices. The method may further comprise, compressing the input data from a first size to a second size that is smaller than the first size, and selecting an ECC from the Plurality of ECC In one embodiment, selecting the ECC from the plurality of ECCs comprises selecting a BCH code from a plurality of BCH codes. One of the plurality of BCH codes may be a base code and at least one other of the plurality of BCH codes may be a sub-code of the base code. The selecting may include selecting the base code or the sub-code, wherein the In another embodiment, the method may further include decoding the encoded input data written into the memory device based on the selected ECC, wherein the decoding results in decoded input data; and decompressing the decoded input data to recover the input data.

In other embodiments, an article of manufacture including a non-transitory computer readable medium is disclosed. The non-transitory computer readable medium may have instructions stored thereon that, if executed by a computing device, cause the computing device to perform operations comprising: receiving input data; encoding the input data with an error correction code (ECC) that is selected from a plurality of ECCs, and writing the encoded data to a memory device. The selected ECC may be selected based on a size of the input data, and the encoded data can be stored across multiple memory devices.

In other embodiments, an apparatus is disclosed. The apparatus comprises a non-volatile memory, and an encoder coupled to the non-volatile memory that is configured to receive data, encode the received data with an error correction code (ECC) that is selected from a plurality of ECCs based on the received data, and provide the encoded data to the non-volatile memory.

In other embodiments, the apparatus also comprises a data compressor coupled to the encoder that is configured to compress the received data from a first size to a second size, and wherein the encoder is further configured to select the ECC from the plurality of ECCs based at least in part on a compression ratio of the second size to the first size. The apparatus can also include a decoder coupled to the non-volatile memory that is configured to decode the encoded data based on the selected ECC to produce decoded data, and a data decompressor that is configured to decompress the decoded data to recover the received data.

This brief summary has been provided so that the nature of the invention may be understood quickly. A more complete understanding of the invention can be obtained by reference to the following detailed description of the preferred embodiment thereof in connection with the attached drawings

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF DISCLOSED EMBODIMENTS

Figure 1:
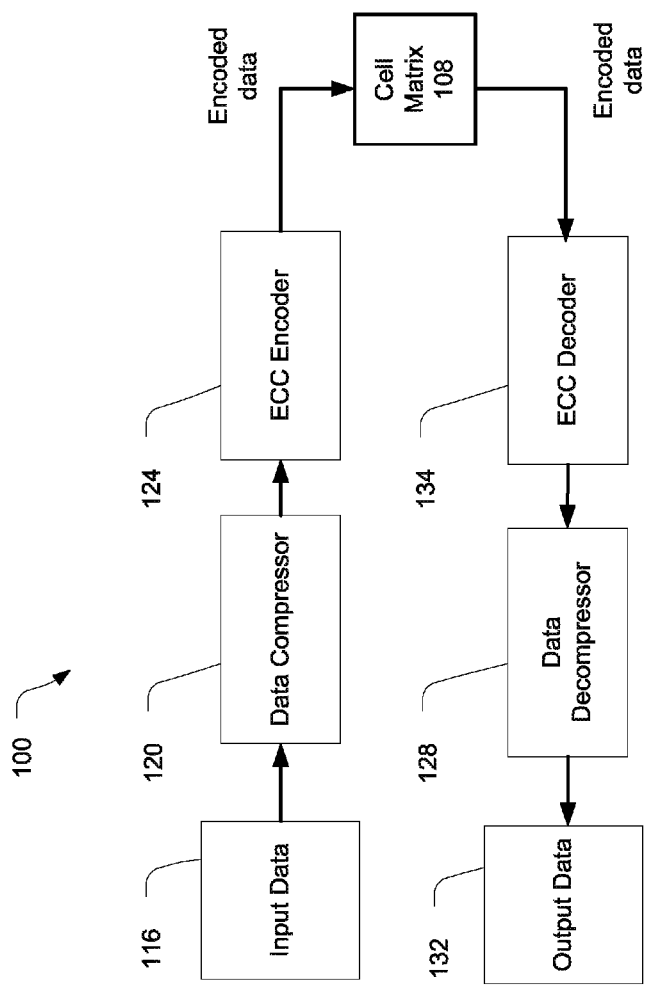
FIG. 1 illustrates a nonvolatile memory device in accordance with various embodiments.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The description may use the terms "embodiment" or "embodiments," which may each refer to one or more of the same or different embodiments. Furthermore, the terms "comprising," "including," "having," and the like, as used with respect to embodiments, are synonymous.

As described previously, ECC schemes utilized to improve data reliability are channel dependent. That is, the ECC scheme is chosen to adapt to the channel conditions in a predetermined manner. According to various embodiments of the present disclosure, an ECC scheme adapts to the incoming data independent of the channel. In other words, the ECC scheme is data dependent.

In various embodiments, incoming data frames, referred to as pages or sectors, are subjected to data compression. The compressed data frames are then subjected to ECC encoding with one of a plurality of predetermined codes. Which code is utilized in conjunction with the compressed data frame is determined by the space made available through compression of the data frame. For example, the system selects the strongest code available subject to the constraint that the encoded output data size is smaller than a predetermined maximum.

As will be discussed in detail herein, the predetermined plurality of codes includes at least one base code of which the remaining codes are sub-codes. This base code and sub-code structure enables an encoder/decoder pair to be used with codes of varying strengths. The strength of an ECC is defined as the ability of the ECC to detect and correct errors. Additionally, the strength of an ECC is proportional to its memory requirement, i.e., stronger codes require more memory. Throughout this disclosure, reference is made to ECC or codes. Such codes include, but are not limited to, parity codes, Bose-Chadhuri-Hocquenghem (BCH) codes, Reed-Solomon codes, or low-density parity check (LDPC) codes. The invention is not to be limited in this regard, however, as to the type of code, parity, or otherwise, as long as error correction capabilities are provided.

To retrieve the encoded and stored data, an ECC decoder must retrieve and decode the stored data. The ECC decoder utilizes the same ECC used for encoding. In various embodiments, the particular error correction codes applied in the encoder is known or unknown to the ECC decoder. Once the data is decoded, the data can be decompressed and output to, for example, a host device.

FIG. 1 illustrates an NVM device 100 in accordance with various embodiments. The NVM device 100 includes a data compressor 120, an ECC encoder 124, a cell matrix 108, an ECC decoder 134, and a data de-compressor 128. In at least one embodiment, the cell matrix 108 can be a matrix of multilevel memory cells that are each formed by a floating gate metal oxide semiconductor (MOS) transistor. In other embodiments, other transistor or components may be used. The NVM device 100 may include other elements without deviating from the scope of this disclosure.

The data compressor 120 receives input data 116 that is to be stored in cell matrix 108. The input data can be received from any number of devices, e.g., a host device, and is generally received in a fixed size such as a page or sector. Upon receipt of the input data, the data compressor 120 compresses the data. The data compressor 120 may compress the data from a first size to a second size, wherein the second size is smaller than the first size. The compression is a non-lossy compression such that the originally received data is capable of decompression at a later stage with minimal loss of data. Alternatively, the compression could be lossy such that certain data is lost.

The ECC encoder 124 is coupled to the data compressor 120 and is configured to encode the compressed input data and write the encoded compressed input data and parity information into the cell matrix 108. In an encoding operation provided by the ECC encoder 124, a number of information bits and a number of parity information bits are generated based on a selected ECC, assuming systematic ECC is used. The information bits represent the input data. The parity information bits are used to detect and correct errors that occur in the subsequent retrieval of the information bits. Both the information bits and the parity information are written to the memory.

The selected ECC is one of a plurality of codes utilized for the coding scheme. Each of the plurality of codes has an associated strength. As mentioned previously, an ECC's strength refers to its ability to detect and correct errors. Consequently, selecting a stronger ECC for the ECC encoder 124 to encode the input data 116 results in the stored input data 116 being more impervious to error.

The ECC decoder 134 of the NVM device 100 is coupled to the cell matrix 108. The ECC decoder 134 receives the data stored in cell matrix 108, which can be accessed by using one or more sense amplifiers to read voltage levels, Vt, of the various cells and determine the logic level, or "cell state" by comparing the voltage levels to one or more threshold values. The cells can have more than two logic levels, or "cell states," determined by the one or more sense amplifiers comparing the Vt of a particular multi-level cell to a plurality of voltage thresholds. Thus, a logic level may correspond to a discrete range of Vt.

The ECC decoder 134 is configured to decode the received, encoded data in a manner that is complementary to the encoding operation of the ECC encoder 124. To perform the decoding operation, the ECC decoder 134 must use the ECC used in the encoding operation or its mother codes performed by the ECC encoder 124. Due to the dynamic selection of the ECC from a plurality of ECCs during the encoding operation, e.g., selection based on the amount of data compression, the ECC decoder 134 determines the proper ECC in different manners.

In one embodiment, the ECC decoder 134 retrieves the ECC from meta-data associated with the encoded, input data. For example, during an encoding operation performed by the ECC encoder 124, the ECC encoder 124 encodes the input data and stores the ECC into the meta-data associated with the encoded data. This enables the ECC decoder 134 to recover the code, but has an associated overhead because more information is being stored within the cell matrix 108.

In another embodiment, the ECC decoder 134 has no knowledge of the ECC used during the encoding operation. Rather, to decode the encoded data, the ECC decoder 134 selects one ECC from the plurality of ECCs, stored for instance in an ECC library, and attempts to decode the encoded data. In the case of a decoding failure, the ECC decoder 134 selects another ECC from the plurality of ECCs and again attempts to decode the encoded data. This continues, iteratively moving through the ECCs of the plurality of ECCs until a decoding success, or until all the ECCs within the plurality are exhausted. This iterative process is available when a base code and its sub-codes are used in an encoding process because the ECC decoder 134 may decode any of its sub-codes. For example, assuming C1 is a base code, C2 is a sub-code of C1, and C3 is a sub-code of C2, an ECC decoder 134 corresponding to C1 can decode sub-codes C2 and C3.

In selecting the first ECC from the plurality of ECCs to decode the encoded data, the ECC decoder 134 generally selects the base code. Selecting the base code for the first attempt has the advantage of attempting the lowest cost ECCs first, where cost can be time to execute or a required amount of power.

Figure 2:
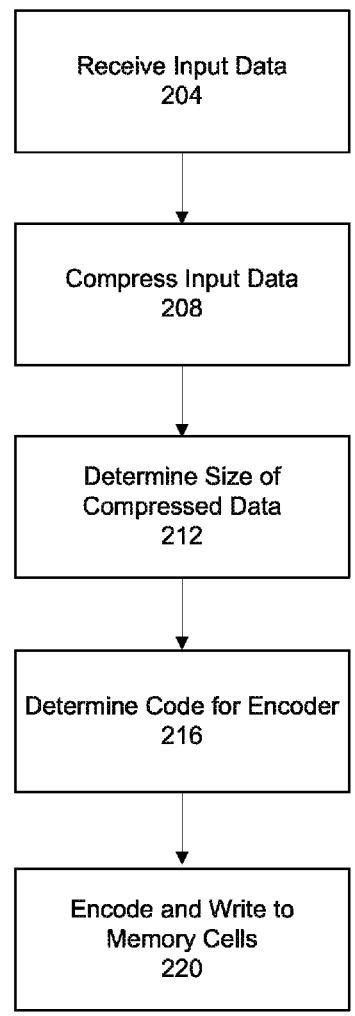
FIG. 2 illustrates a flow diagram in accordance with various embodiments.

Referring now to FIG. 2, a write operation involving the data compressor 120 and ECC encoder 124 is described in accordance with various embodiments. At 204, the data compressor 120 receives input data 116 from a digital source, e.g., a host device. The input data 116 is generally received in a fixed size, such as a page. At 208, the data compressor 204 compresses the input data 116. The compression of the input data 116 is non-lossy compression. This non-lossy compression allows retrieval of the original input data via decompression at a later stage.

At 212, the size of the compressed data is determined. In various embodiments, either the data compressor 120, the ECC encoder 124, or another device such as a memory controller (not shown), determines the size of the compressed data. The amount of data compression impacts the amount of memory that is utilized for redundancy, such as parity bits. As space for more parity bits become available, stronger codes also become available for the ECC encoder 124. As the strength of the ECC increases, the more robust the memory device is to errors.

At 212, the ECC encoder 124 determines an ECC from the plurality of ECCs to use in encoding the compressed input data. This selection is based, at least in part, on the amount of data compression. In various embodiments, the ECC encoder 124 selects the ECC with the highest correction power from the set of codes, subject to the constraint that the encoded data size is smaller than a predetermined maximum. In other words, the strongest code from the set of codes is utilized based on the memory constraints. This is described in more detail herein.

The set of codes or ECCs utilized by the ECC encoder 124 includes at least one base code. The ECCs can be determined by a user of the memory device, or alternatively, by a manufacturer of the memory device. The remaining ECCs of the plurality of ECCs are all sub-codes of the base code. Because all ECCs are either a sub-code of the base code or the base code itself, the decoder is capable of decoding the encoded data with or without knowledge of the ECC used by the ECC encoder 124.

At 220, the ECC encoder 124 encodes the compressed input data with the selected ECC and writes the parity bits and the information bits to the cell matrix 108.

As an example of a write process, a system defines a set of (Q) codes. As mentioned previously, the codes may be parity codes, BCH codes, or Reed-Solomon codes. The set of codes include at least a base code (C) and sub-codes (Ca) and (Cb). In various embodiments, the base code has the lowest error detection and correction capability. Consequently, as a device experiences more degradation, the base code becomes less capable of detecting and correcting errors. (Ca) is a stronger code having a stronger error detection and correction capability, and (Cb) is the strongest code having the strongest error correction and detection capability. As the codes become stronger, more memory is required to store the code. This impacts the amount of memory that may be used for data. Consequently, either a smaller amount of data may be stored in each sector, or alternatively, the data must be compressed to account for the loss in space attributed to the stored code.

If we assume the plurality of codes are BCH codes based on Galois field $GF(2^{16})$, the code set (Q) includes three BCH $(GF(2^{16}))$ codes with correction power (T)=128, 148, and 168 corresponding, respectively, to (C), (Ca), and (Cb). Additionally, the codes have differing memory requirements, for example, (C) requires the least amount of memory, followed by (Ca), and (Cb), each requiring more memory than the former.

Continuing with the example, let's assume a sector of data, such as input data 116, has an original sector size (Su) of 4,096 Bytes, and the cell matrix has a defined maximum admissible sector size (Sm) of 4,352 Bytes. The maximum admissible sector size (Sm) enable storage of 4096 Bytes of data and 256 Bytes of system data, meta-data, and/or ECC parity data. If the data sector experiences no data compression, the sector size after compression (Sc) is equal to the original sector size (Su). Consequently, a compression ratio ((Sc)/(Su)) is equal to one, e.g., no compression and the maximum number of parity bits allowed for ECC encoder is 256 Bytes. Selecting the strongest code subject to the constraint that the encoded data sector size is less than the maximum admissible sector size results into the ECC encoder 124 using the base BCH code (C) with an error correction power of (T)=128. The use of any other code, (Ca) or (Cb), is prohibited because of their need for increased memory. If they were used to encode the data, the sector size would be larger than the maximum admissible sector size.

If, however, the compressed sector size (Sc) after compression is, for example 3,932 Bytes, the compression ratio becomes 0.96. In this example, the maximum number of parity bits has increased to 420 Bytes, due to the compression of the data. Thus, the ECC encoder 124 can be configured to encode the compressed data sector with increased error correction power, i.e. (Ca) or (Cb). As a consequence of the compression, the data is now more robust to errors.

There may be instances where the compression of data enables use of parity bits beyond those that result from use of the strongest code from the plurality of codes. In such instances, due to complexity constraints, the ECC encoder may opt to encode the compressed data with the ECC having the highest correction power.

Figure 3:
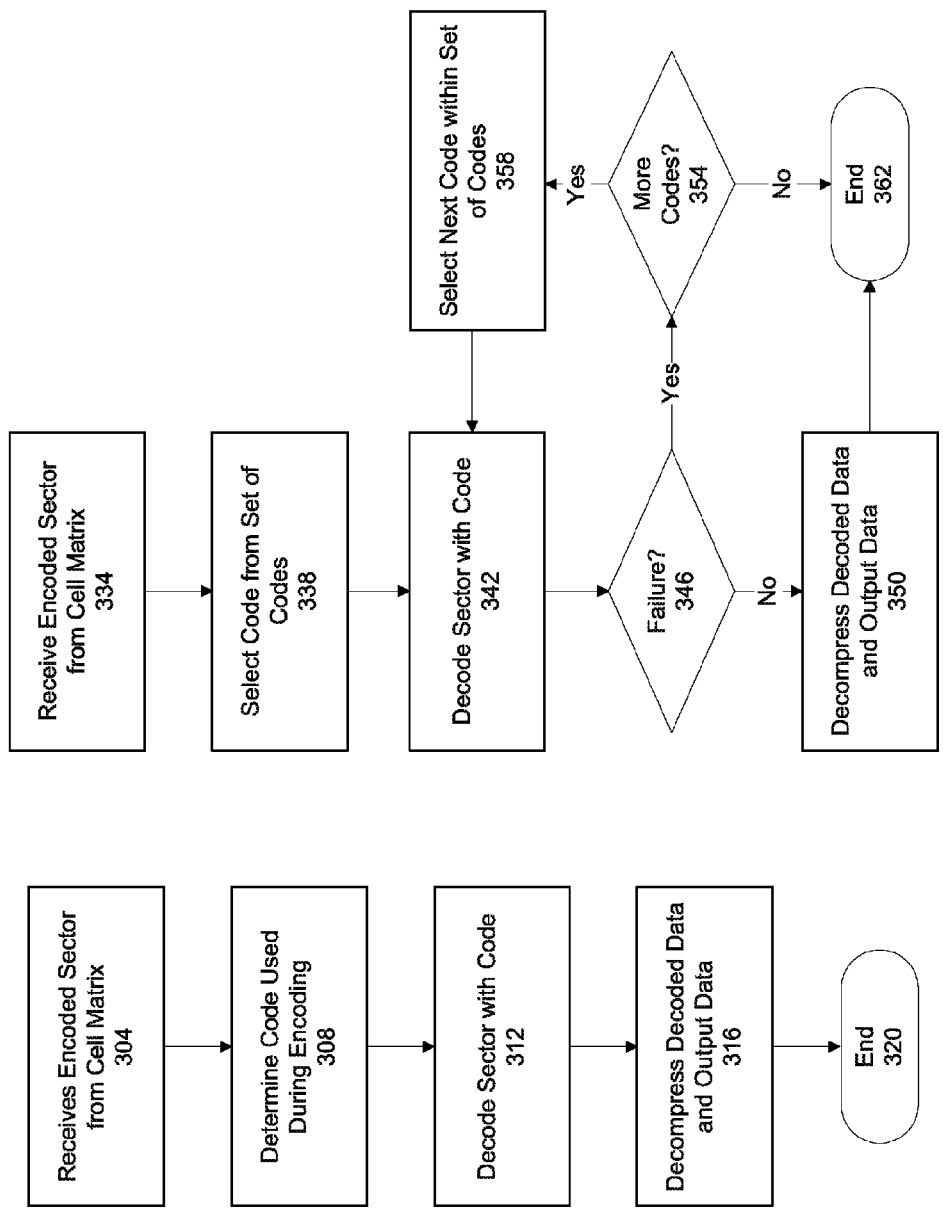
FIGS. 3a and 3b illustrate flow diagrams in accordance with various embodiments.

FIGS. 3a and 3b illustrate various embodiments of a read operation, in accordance with the disclosure. FIG. 3a describes operation of the ECC decoder 134 and data decompressor 128 when the ECC used by the ECC encoder 124 is provided to or known by the ECC decoder 134. FIG. 3b describes operation of the ECC decoder 134 and data decompressor 128 when the ECC used by the ECC encoder 124 is unknown to the ECC decoder 134.

Referring to FIG. 3a, the ECC decoder 134 receives the encoded sector from the cell matrix 108. At 308, the ECC decoder 134 determines the ECC used during the encoding operation by the ECC encoder 124. In various embodiments, the ECC can be provided by the system, for example a memory controller, or alternatively, the ECC can be stored in the meta-data associated with the encoded data. After determining the ECC used during the encoding operation, at 312, the ECC decoder 124 decodes the encoded data.

Following the decoding operation 312, at 316, a data decompressor 128 decompresses the decoded data and outputs the data. As mentioned previously, due to the non-lossy compression, the original input data is recovered with minimal errors due to the compression. After the data is output, the method ends at 320, or alternatively, repeats for a new sector of data.

Referring to FIG. 3b, a method of reading encoded data from cell matrix 108 when the ECC used during the encoding operation is unknown to the ECC decoder 134 is illustrated. At 334, the ECC decoder 134 receives the encoded data or sector from the cell matrix 108.

At 338, the ECC decoder 134 selects a first ECC from the plurality of ECCs to decode the encoded data. In various embodiments, the ECC decoder 134 selects the base code as the first ECC. After the first ECC is selected, the ECC decoder 134 attempts to decode the encoded data using the selected ECC. Upon a successful decoding at 346, which may be determined in a number of manners, for example, by a retrieval of useful information, the method continues to 350 where the data decompressor 128 decompresses the decoded data and outputs the data to, for example, a host device.

Returning to 346, if the selected ECC fails to decode the encoded data, the ECC decoder 134 determines if there are more ECCs within the plurality of ECCs. In response to a determination that more ECCs have not been used in an attempt to decode the encoded data, the method continues to 358 where a new ECC is selected. In various embodiments, the new ECC is a sub-code of the base code having a correction power higher than the base code. Upon selecting the new ECC, the ECC decoder 134, again, attempts to decode the encoded data with the newly selected ECC. Upon continued failures, new ECCs are selected until the ECC decoder 134 successfully decodes the encoded data or all ECCs within the plurality of ECCs have been exhausted. If all the ECCs have been exhausted, the method ends at 362.

Continuing with our example discussed above, an example of a read process is provided. Again, assuming the use of BCH codes, if the BCH code used by the ECC encoder 124 is provided to ECC decoder 134, for example in the meta-data appended to the information bits, the informed ECC decoder 134 decodes the encoded data with the BCH code, for example the BCH code (Cb) having a correction power (T)=168.

Alternatively, if the ECC decoder 134 has no knowledge of the BCH code used by the ECC encoder 124, the ECC decoder 134 attempts to decode the encoded data with the base code (C), having a correction power (T)=128. Assuming the ECC encoder 124 used BCH code (Cb) for the encoding operation and the number of errors in the data is 160, which is more than 128, the decoding operation fails. Consequently, the ECC decoder 134 selects BCH code (Ca) having a correction power (T)=148, and attempts to decode the encoded data. Again, the decoding fails. The ECC decoder 134 then selects the last BCH code within the plurality of codes and attempts to decode the encoded data. This time, because the bit errors of 160 is less than the error correction power of Cb which is 168, there is a decoding success. After decoding success, the data decompressor 128 decompresses and ultimately outputs the decompressed data.

Figure 4:
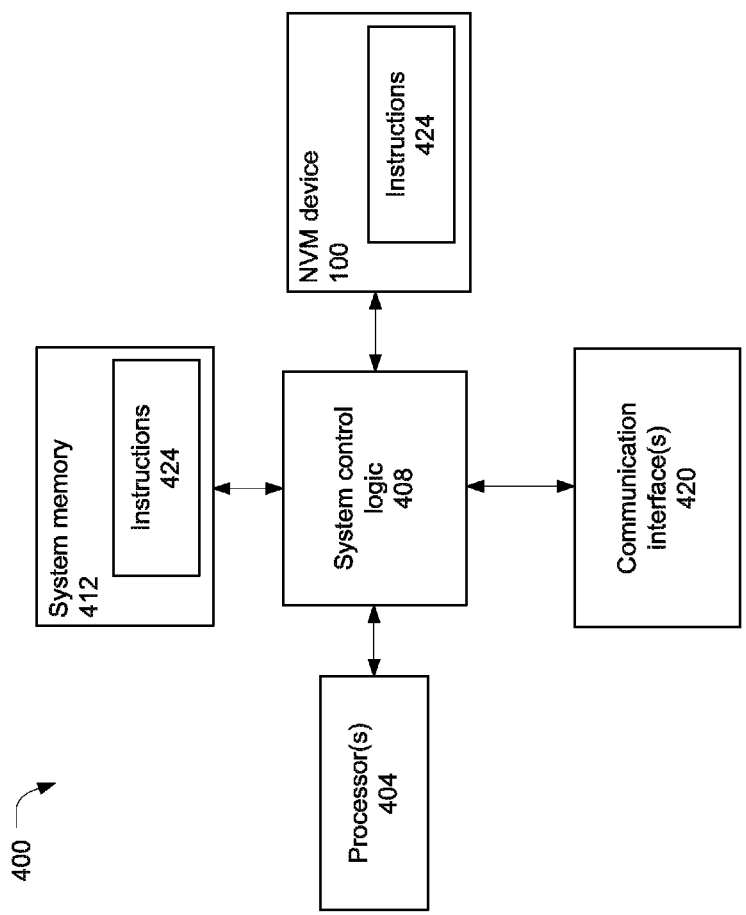
FIG. 4 illustrates a host device incorporating a nonvolatile memory device in accordance with an embodiment.

FIG. 4 illustrates a host device 400 capable of hosting the NVM device 100, in accordance with various embodiments. The host device 400 includes one or more processors 404; system control logic 408 coupled to at least one of the processor(s) 404; system memory 412 coupled to the system control logic 408; the NVM device 100 coupled to the system control logic 408; and one or more communication interface(s) 420 coupled to the system control logic 408.

System control logic 408 includes any suitable interface controllers to provide for any suitable interface to the components with which it is coupled.

System memory 412 can be used to load and/or store data/instructions, for example, for the host device 400. System memory 412 includes any suitable volatile memory, such as, but not limited to, suitable dynamic random access memory (DRAM).

The NVM device 100 can also be used to load and/or store data/instructions, for example, for the host device 400. The NVM device 100 includes any suitable nonvolatile memory, such as, but not limited to, NOR flash memory or NAND flash memory.

In some embodiments, logic includes instructions 424 that when executed by the processor(s) 404 result in the host device 400 and/or the NVM device 100 performing at least some of the operations described herein. The instructions may be located in the NVM device 100 and/or the system memory 412. In some embodiments, the instructions 424 may additionally/alternatively be located in the system control logic 408.

Communication interface(s) 420 provides an interface for the host device 400 to communicate over one or more networks and/or with any other suitable device. Communication interface(s) 420 includes any suitable hardware and/or firmware. Communication interface(s) 420, in various embodiments, includes, for example, a network adapter, a wireless network adapter, a telephone modem, and/or a wireless modem. For wireless communications, communication interface(s) 420 may use one or more antennas.

For one embodiment, at least one of the processor(s) 404 is packaged together with logic for one or more controllers of system control logic 408. For one embodiment, at least one processor of the processor(s) 404 is packaged together with logic for one or more controllers of system control logic 408 to form a System in Package (SiP). For one embodiment, at least one processor of the processor(s) 404 is integrated on the same die with logic for one or more controllers of system control logic 408. For one embodiment, at least one processor of the processor(s) 404 is integrated on the same die with logic for one or more controllers of system control logic 408 to form a System on Chip (SoC).

In various embodiments, the host device 400 is a desktop or laptop computer, a server, a set-top box, a digital recorder, a game console, a personal digital assistant, a mobile phone, a digital media player, a digital camera, etc. The host device 400 may have more or less components and/or different architectures.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method for writing input data into a memory device, the method comprising:
   receiving input data;
   compressing, by a data compressor, the input data to produce compressed input data, wherein the compressed input data has a compressed size;
   selecting, by an encoder, a first error correction code from a plurality of error correction codes, wherein the first error correction code is selected from the plurality of error correction codes based on the compressed size of the compressed input data;
   encoding, by the encoder, the compressed input data with the first error correction code selected from the plurality of error correction codes; and
   writing the compressed input data, as encoded by the encoder, to the memory device.

2. The method of claim 1, wherein writing the compressed input data, as encoded by the encoder, to the memory device comprises:
   writing a first portion of the compressed input data, as encoded by the encoder, to a first memory device; and
   writing a second portion of the compressed input data, as encoded by the encoder, to a second memory device,
   wherein the first memory device is different than the second memory device.

3. The method of claim 1,
   wherein selecting the first error correction code from the plurality of error correction codes comprises selecting the first error correction code based at least in part on a compression ratio of the compressed input data.

4. The method of claim 3, wherein selecting the first error correction code from the plurality of error correction codes comprises selecting a Bose-Chadhuri-Hocquenghem (BCH) code from a plurality of BCH codes.

5. The method of claim 4, wherein:
   a first BCH code of the plurality of BCH codes is a base code;
   a second BCH code of the plurality of BCH codes is a sub-code of the base code; and
   selecting the BCH code from a plurality of BCH codes comprises selecting the sub-code, wherein the sub-code has a higher correction power than the base code.

6. The method of claim 1 further comprising:
   decoding, by a decoder, the compressed input data as written into the memory device, wherein the decoding of the compressed input data as written into the memory is based on the first error correction code, the decoding resulting in decoded compressed input data; and
   decompressing, by a decompressor, the decoded compressed input data to recover the input data.

7. The method of claim 6, further comprising:
   determining, by the decoder, the first error correction code to enable the decoding of the compressed input data as written into the memory device.

8. The method of claim 7, wherein determining the first error correction code to enable the decoding of the compressed input data as written into the memory device comprises:
   retrieving the first error correction code from meta-data associated with the encoded compressed input data.

9. The method of claim 7, wherein determining the first error correction code to enable the decoding of the compressed input data as written into the memory device comprises:
   determining the first error correction code by iteratively utilizing the plurality of error correction codes.

10. An article of manufacture including a non-transitory computer-readable medium having instructions tangibly stored thereon, wherein the instructions are executable by a computing device to cause the computing device to perform operations comprising:
    receiving input data to be written into a memory device, wherein the input data having has a first size;
    compressing the input data to produce compressed input data, wherein the compressed input data has a second size smaller than the first size;
    selecting a first error correction code from a plurality of error correction codes, wherein the first error correction code is selected from the plurality of error correction codes based on the second size of the compressed input data;
    encoding the compressed input data with the first error correction code selected from the plurality of error correction codes; and
    subsequent to encoding the compressed input data with the first error correction code, writing the compressed input data, as encoded, to the memory device.

11. The article of manufacture of claim 10, wherein writing the compressed input data, as encoded, to the memory devices comprises:
    writing a first portion of the compressed input data, as encoded, to a first memory device; and
    writing a second portion of the compressed input data, as encoded, to a second memory device,
    wherein the first memory device is different than the second memory device.

12. The article of manufacture of claim 10,
    wherein selecting the first error correction code from the plurality of error correction codes comprises selecting the first error correction code from the plurality of error correction codes based at least in part on a compression ratio of the second size to the first size.

13. The article of manufacture of claim 12, wherein the selected first error correction code is a Bose-Chadhuri-Hocquenghem (BCH) code selected from a plurality of BCH codes.

14. The article of manufacture of claim 13, wherein the plurality of BCH codes includes a base code and at least one other of the plurality of BCH codes that is a sub-code of the base code.

15. The article of manufacture of claim 12, wherein the operations further comprise:
    decoding the compressed input data, as written into the memory device, wherein the decoding of the compressed input data as written into the memory is based on the first error correction code; and
    decompressing the decoded compressed input data to recover the received input data.

16. The article of manufacture of claim 15, wherein the operations further comprise:

determining the first error correction code to enable the decoding of the compressed input data as written into the memory.

17. The article of manufacture of claim 15, wherein the operations further comprise:
determining the first error correction code by iteratively utilizing the plurality of error correction codes.

18. An apparatus, comprising:
a non-volatile memory;
a data compressor, the data compressor configured to compress data from a first size to a second size; and
an encoder coupled to the non-volatile memory, the encoder configured to
select a first error correction code from a plurality of error correction codes, wherein the first error correction code is selected from the plurality of error correction codes based on the second size of the compressed data,
encode the compressed data with the first error correction code selected from the plurality of error correction codes, and
write the compressed data, as encoded, to the non-volatile memory.

19. The apparatus of claim 18,
wherein the encoder is further configured to select the first error correction code from the plurality of error correction codes based at least in part on a compression ratio of the second size and the first size.

20. The apparatus of claim 19, further comprising:
a decoder coupled to the non-volatile memory, the decoder configured to decode the compressed data as written into the non-volatile memory, wherein the decoding of the compressed data as written into the non-volatile memory is based on the first error correction code, the decoding resulting in decoded compressed data; and
a data decompressor coupled to the decoder, the data decompressor configured to decompress the decoded compressed data to recover the data.

21. The apparatus of claim 20, wherein the decoder is further configured to retrieve the first error correction code from the non-volatile memory.

22. The apparatus of claim 20, wherein the decoder is further configured to determine the first error correction code by iteratively utilizing the plurality of error correction codes.

* * * * *